United States Patent
Husted et al.

(10) Patent No.: US 8,160,515 B1
(45) Date of Patent: Apr. 17, 2012

(54) NEGATIVE AMPLITUDE POLAR TRANSMITTER

(75) Inventors: Paul J. Husted, San Jose, CA (US); David J. Weber, Mountain View, CA (US); William J. McFarland, Los Altos, CA (US); William W. Si, San Jose, CA (US)

(73) Assignee: Qualcomm Atheros, Inc., San Jose, CA (US)

(*) Notice: Subject to any disclaimer, the term of this patent is extended or adjusted under 35 U.S.C. 154(b) by 1027 days.

(21) Appl. No.: 12/110,236

(22) Filed: Apr. 25, 2008

Related U.S. Application Data

(60) Provisional application No. 60/914,643, filed on Apr. 27, 2007.

(51) Int. Cl.
*H03C 1/62* (2006.01)
*H04B 17/00* (2006.01)

(52) U.S. Cl. .............. 455/115.1; 455/108; 455/126

(58) Field of Classification Search ............ 455/91, 455/102, 108, 110–112, 115.1, 126
See application file for complete search history.

(56) References Cited

U.S. PATENT DOCUMENTS

| | | | |
|---|---|---|---|
| 7,359,685 B2* | 4/2008 | Jafari et al. | 455/126 |
| 7,881,401 B2* | 2/2011 | Kraut et al. | 375/296 |
| 2007/0184795 A1* | 8/2007 | Drogi et al. | 455/127.1 |

* cited by examiner

*Primary Examiner* — Christian Hannon
(74) *Attorney, Agent, or Firm* — Bever, Hoffman & Harms, LLP

(57) ABSTRACT

A polar transmitter includes a phase monitoring unit for monitoring input modulating data. When a phase transition exceeds a phase transition threshold, the phase monitor unit can signal an amplitude negation unit to invert the amplitude data coupled to the polar amplifier. The phase monitoring unit can also add an offset to the phase data that is provided to a frequency synthesizer. In another embodiment, when the phase transition threshold is exceeded, the phase monitoring unit can trigger inverting differential frequency data coupled to the polar amplifier. In one embodiment, the phase offset and the amplitude negation are applied until a second phase transition value exceeding the phase transition threshold is detected. If such an event is detected, then the input amplitude data is no longer inverted and the phase offset value is no longer added to the modulating data.

27 Claims, 9 Drawing Sheets

NEGATIVE AMPLITUDE POLAR TRANSMITTER

RELATED APPLICATIONS

This application claims priority of U.S. Provisional Patent Application 60/914,643, entitled "Negative Amplitude Polar Transmitter" filed Apr. 27, 2007.

BACKGROUND OF THE INVENTION

1. Field of the Invention

Embodiments of the specification generally relate to wireless communications and more specifically to a negative amplitude polar transmitter.

2. Description of the Related Art

Wireless communications systems generally use radio frequency (RF) signals to transmit data from a transmitter to one or more receivers. Wireless communication systems are frequently used to implement wireless local area networks (LANs) in which data is transmitted and received between computers, servers, Ethernet switches, hubs, and the like. A wireless LAN may, for example, enable web page data to be transferred between a server and a computer.

Wireless communication systems often transmit data through transmitters that use traditional heterodyne architectures. These architectures typically involve the creation of Cartesian (I and Q) waveforms and then up-mixing the waveforms to a desired frequency. Heterodyne architectures, unfortunately, may require many processing units to handle the Cartesian waveforms, such as a plurality of low-pass filters, baseband amplifiers, mixers and a linear RF amplifier.

Polar transmission architectures may reduce the size and power consumption of a transmitter by, among other things, removing one or more up-mixing stages from the transmitter. Polar transmitters are typically configured to transmit data based upon amplitude and phase waveforms rather than Cartesian I and Q waveforms. The amplitude typically ranges from zero to one (i.e. amplitude values may be normalized) and the phase values typically range from zero to +/−π. The phase values are cyclic with a period of 2π. In one embodiment, the derivative of phase data with respect to time is frequency. Thus, a change of a phase value of π represents the maximum frequency deviation that the polar transmitter may produce.

FIG. 1 is a conceptual diagram of a standard polar transmitter 100, which includes a polar amplifier 101 and a frequency synthesizer 102. The phase waveform may be determined by frequency synthesizer 102 and the amplitude waveform may be determined by amplitude data. Inputs to frequency synthesizer 102 may be modulating data and carrier frequency data. In one embodiment, the carrier frequency may be between 2402 and 2480 MHz and the modulating data may be +/−4 MHz, thereby enabling polar transmitter 100 to transmit frequencies commonly used by Bluetooth™ equipment (which may be specified by Bluetooth™ Special Interest Group). The output of frequency synthesizer 102 is a modulated frequency waveform. Both the modulated frequency waveform and the amplitude data are provided to the inputs of polar amplifier 101, which modulates both the modulated frequency waveform and the amplitude data and constructs an RF signal for transmission. In one embodiment, polar transmitter 100 may be implemented, in part, as a discrete-time system.

One drawback of polar transmitter 100 is that relatively large changes in frequency may be difficult to accurately produce within frequency synthesizer 102. In some cases, frequency synthesizer 102 may not be able to produce the required frequency. As a result, polar transmitter 100 may transmit a distorted or erroneous signal, which may reduce the overall performance of the transmitter. In the case of polar transmitters, a relatively large frequency change is one in which the difference between phase values of two polar transmission points is relatively close to π. Phase values are described in greater detail below in FIGS. 2A and 2B.

FIGS. 2A and 2B are graphs illustrating two polar transmission points for a polar transmitter. FIG. 2A illustrates a first transmission point y, which may be described in polar form by amplitude A and phase value θ. FIG. 2B illustrates a second transmission point ŷ. In this example, point ŷ has a different amplitude B and a different phase value compared to point y. As shown in FIG. 2B, the phase value of point ŷ is offset by π from phase value of point y. Therefore, point ŷ represents the maximal frequency deviation possible from point y.

Points y and ŷ may represent two transmission points of a discrete-time polar transmitter. As is well-known, many discrete-time systems may be configured to process data in an oversampled manner. An oversampled discrete-time system may use a relatively greater sampling frequency (and therefore relatively more samples) to process data than the fewest number of samples required by the Nyquist theorem (e.g. an eight times oversampled system may use eight times the Nyquist sample rate to process data). If an oversampled polar transmitter is used to transmit the points y and ŷ, then additional points between y and ŷ may be transmitted as well. These additional points are shown as squares in FIG. 2B.

FIGS. 3A, 3B, and 3C are graphs illustrating amplitude, phase and frequency waveforms, respectively, that may occur when moving from a first transmission point to a second polar transmission point using the discrete-time polar transmitter of FIG. 1. In this example, the first polar transmission point is point y in FIG. 2A and the second polar transmission point is point ŷ in FIG. 2B.

The amplitude waveform of FIG. 3A shows the amplitude of point y (A) and the amplitude of point ŷ (B). FIG. 3A also shows additional amplitude points that may be due to oversampling as the amplitude decreases from A, goes to zero, and increases to B. As shown in the phase waveform of FIG. 3B, the difference between the phase value at point y and the phase value at point ŷ (i.e. the phase transition) is π.

Note that the phase transition is also reflected as a frequency change (see FIG. 3C) because, in one embodiment, the derivative of the phase data is frequency data. Further, because the phase transition is a step function, the frequency change is an impulse function. In a discrete time system, the width of the impulse may be 1/(sampling period T) as shown in the FIG. 3C.

As indicated above, one drawback of a polar transmitter is that it may be relatively difficult to process relatively large frequency changes. In particular, a frequency synthesizer may not be able to track relatively a large frequency change, such as that shown in FIG. 3C. Furthermore, as the sampling rate increases, the height of the impulse in FIG. 3C increases, thereby indicating relatively greater frequency change requirements in relatively shorter times. Thus, relatively higher sampling rates require a frequency synthesizer to be able to track relatively greater changes in frequency.

Therefore, what is needed is a polar transmitter architecture that can support relatively large changes in phase and frequency.

SUMMARY OF THE INVENTION

To support relatively large changes in phase and frequency, a polar transmitter can use negative amplitude data to advantageously reduce the relative size of phase transitions. Because the transmit frequency is directly related to the size of the phase transitions, relatively smaller phase transitions may require relatively smaller frequency deviations, which may be easier to synthesize. In one embodiment that uses negative amplitude data, a polar transmitter can include a phase monitoring unit, an amplitude negation unit, a frequency synthesizer, and a polar amplifier. The phase monitoring unit monitors input modulating data and generates a control signal and output modulating data based on that input modulating data. The amplitude negation unit receives amplitude data as well as the control signal from the phase monitoring unit. The frequency synthesizer receives carrier frequency data and the output modulating data from the phase monitoring unit. The polar amplifier receives outputs of the amplitude negation unit and the frequency synthesizer.

In one embodiment, the value of the control signal can be based on whether a phase transition in the input modulating data exceeds a predetermined threshold. In one embodiment, the predetermined threshold is set to a fraction of $\pi$. When the phase transition does not exceed the predetermined threshold, the amplitude negation unit merely outputs the amplitude data and the phase monitoring unit merely outputs the input modulating data as the output modulating data. In contrast, when the phase transition exceeds the predetermined threshold, the amplitude negation unit outputs inverted amplitude data and the phase monitoring unit outputs a sum of a phase offset and the input modulating data as the output modulating data. By inverting the amplitude, the phase of the modulated frequency waveform coupled to the polar amplifier is allowed to remain relatively constant. This relatively constant phase may advantageously reduce frequency changes, thereby reducing the response requirement of the frequency synthesizer in the polar transmitter. Note that in one embodiment, the phase offset and the amplitude negation are applied until a second phase transition value exceeding the phase transition threshold is detected. If such an event is detected, then the input amplitude data is no longer inverted and the phase offset value is no longer added to the modulating data.

In another embodiment, a polar transmitter can include a phase monitoring unit, a frequency synthesizer, a switch, and a polar amplifier. In this embodiment, the phase monitoring unit can receive modulating data and generate a control signal based on the modulating data. The frequency synthesizer can receive carrier frequency data as well as the modulating data, and can generate differential data. The switch, e.g. having a double-pole-double-throw (DPDT) architecture, can receive an output of the frequency synthesizer and the control signal (wherein an output of the switch is differential data). The polar amplifier can receive amplitude data and the output of the switch.

Again, the value of the control signal can be based on whether a phase transition in the modulating data exceeds a predetermined threshold. However, when the phase transition exceeds the predetermined threshold in this embodiment, the switch inverts a phase of the output of the frequency synthesizer. In one embodiment, the switch can invert the phase by swapping the differential data provided to the polar amplifier. Advantageously, inverting the phase of the modulated frequency waveform provided to the polar amplifier can produce a phase change of $\pi$ while maintaining a relatively constant frequency.

DETAILED DESCRIPTION OF THE DRAWINGS

One embodiment of a polar transmitter uses negative amplitude data to advantageously reduce the relative size of phase transitions. Because the transmit frequency is directly related to the size of the phase transitions, relatively smaller phase transitions may require relatively smaller frequency deviations, which may be easier to synthesize. In one embodiment, if a phase transition exceeds a phase transition threshold, then the amplitude data for the polar amplifier is inverted and a phase offset is added to the modulating data. By inverting the amplitude, the phase of the modulated frequency waveform coupled to the polar amplifier is allowed to remain relatively constant. This relatively constant phase may advantageously reduce frequency changes, thereby reducing the response requirement of the frequency synthesizer in the polar transmitter. In another embodiment of a polar transmitter, the phase of the modulated frequency waveform provided to the polar amplifier may be inverted, thereby producing a phase change of while maintaining a relatively constant frequency.

Figure 4:
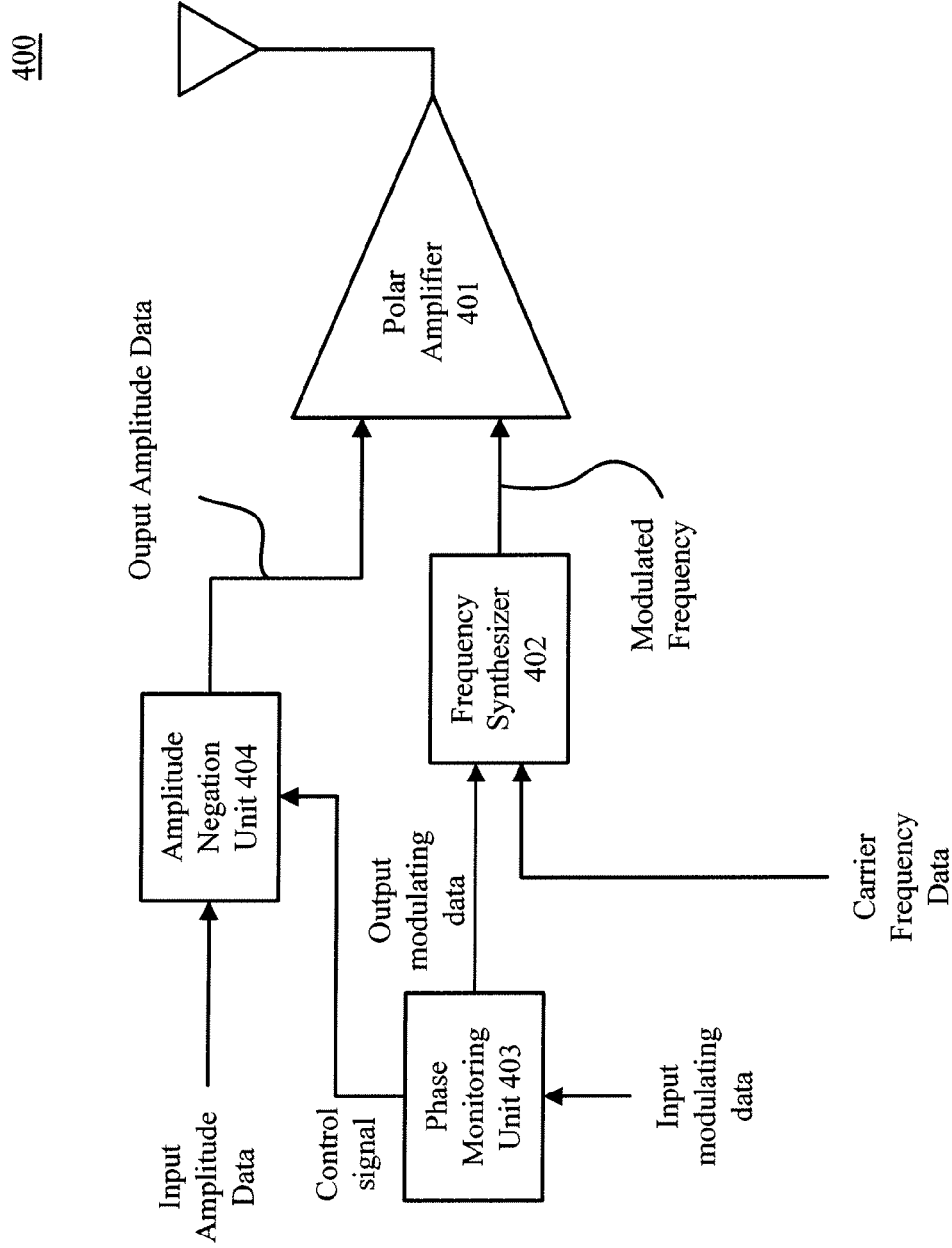
FIG. 4 is a conceptual diagram showing an exemplary polar transmitter configured according to one or more aspects of the specification.

FIG. 4 is a conceptual diagram showing an exemplary polar transmitter 400 configured according to one or more aspects of the specification. In this embodiment, polar transmitter 400 includes a phase monitoring unit 403, a frequency synthesizer 402, an amplitude negation unit 404, and a polar amplifier 401. Modulating data is provided to an input of phase monitoring unit 403. Phase monitoring unit 403 monitors input modulating data and generates output modulating data that is provided to an input of frequency synthesizer 402. Carrier frequency data is provided to another input of frequency synthesizer 402. Frequency synthesizer 402 analyzes the carrier frequency data and the output modulating data and synthesizes a corresponding modulated frequency waveform, which is provided to an input of polar amplifier 401. Amplitude negation unit 404 receives input amplitude data and generates output amplitude data, which is provided to another input of polar amplifier 401 (note that polar amplifier 401 may support both positive and negative amplitude data). Phase monitoring unit 403 provides a control signal to amplitude negation unit 404. Frequency synthesizer 402 and polar amplifier 401 may be of any design known in the art providing frequency synthesis and polar amplification functionality, respectively.

If phase monitoring unit 403 determines that the phase transition in the input modulating data exceeds a phase transition threshold, then phase monitoring unit 403 generates a control signal having a first predetermined value that signals amplitude negation unit 404 to invert the input amplitude data. Note that as used herein, the term "invert" or "negate" refers to an additive inverse operation (i.e. the additive inverse of x is −x). This inverted input amplitude data is provided to polar amplifier 401 as the output amplitude data. Conversely, if phase monitoring unit 403 determines that the phase transition does not exceed the phase transition threshold, then amplitude negation unit 404 generates a control signal having a second predetermined value that signals amplitude negation unit 404 to allow the input amplitude data to pass through to polar amplifier 401 as the output amplitude data. In one embodiment, the phase values of the two polar transmission points may be determined by their associated modulating data, and the phase transition value may be determined by calculating the difference between the phase values of the two polar transmission points.

In one embodiment, the phase transition threshold is exceeded when the absolute value of a phase transition is greater than the phase transition threshold. For example, if the phase transition threshold is set to $$\frac{3}{4}\pi$$

and the phase transition value is determined to be $$-\frac{7}{8}\pi,$$

then the phase transition threshold is exceeded.

When phase monitoring unit 403 signals amplitude negation unit 404 to invert the input amplitude data, phase monitoring unit 403 may also add a phase offset to the input modulating data, thereby generating output modulating data that is different than the input modulating data. Note that when the amplitude data is not inverted, then the output modulating data is the same as the input modulating data. The output modulating data is provided to the input of frequency synthesizer 402. In one embodiment, the phase offset may be the phase transition value. Returning to the example above, if the phase transition value is determined to be $$-\frac{7}{8}\pi,$$

then $$-\frac{7}{8}\pi$$

may be added to the phase of the input modulating data.

The phase and amplitude adjustments have the effect of configuring polar amplifier 401 to transmit a polar transmission point similar to a point determined by the non-adjusted modulated frequency and amplitude data. However, the adjusted modulating data advantageously maintains a relatively constant phase which may be easier for frequency synthesizer 402 to process. The phase transition threshold determines which amplitude and modulating data may be adjusted. In some cases, however, the adjusted data may result in polar amplifier 401 transmitting a signal with some amount of distortion. This is described in greater detail below in reference to FIGS. 7 and 8.

Figure 2A:
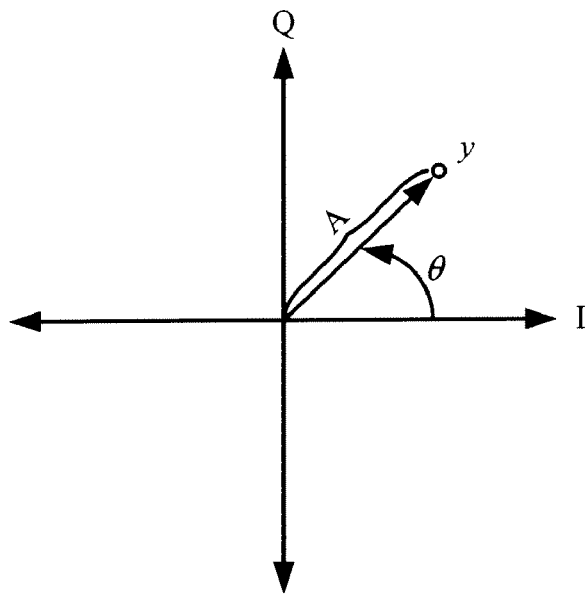
FIGS. 2A and 2B are graphs illustrating two polar transmission points for a polar transmitter.

To illustrate how polar transmitter 401 works, consider the first point y of FIG. 2A with an amplitude of A and a phase of θ. In this example, let the phase transition threshold be $$\frac{3}{4}\pi.$$

Figure 2B:
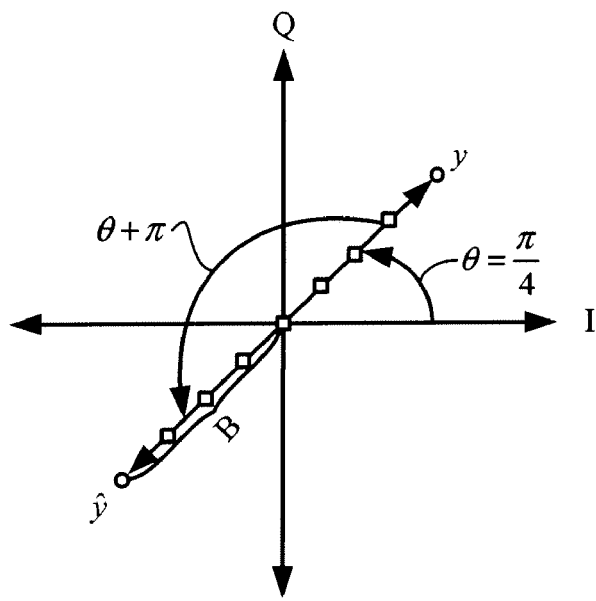

The second point ŷ of FIG. 2B represents a second polar transmission point and has an amplitude of B and a phase of θ+π. The phase monitoring unit determines the phase transition value between the two points. In this example, the phase transition value is π. Because the phase transition value exceeds the phase transition threshold, phase monitoring unit 403 signals amplitude negation unit 404 to invert the input amplitude data (i.e. B) provided to polar amplifier 401. Thus, in this case, the amplitude changes from A to −B (not from A to B).

Phase monitoring unit 403 also adds a phase offset equal to the phase transition value to the modulating data. In this example, the phase offset is π and the phase of the second point ŷ is θ+π. Adding the phase offset π to θ+π returns the phase to θ. In this manner, polar transmitter 401 may transmit a second polar transmission point with an amplitude of −B and a phase of θ, which is relatively equivalent to a polar transmission point having an amplitude of B and a phase of θ+π. By inverting the amplitude, the value of the amplitude decreases from the first polar transmission point, crosses a zero value, and then the amplitude decreases to the value of the second polar transmission point.

In one embodiment, the phase offset and the amplitude negation are applied until a second phase transition value exceeding the phase transition threshold is detected. If such an event is detected, then the input amplitude data is no longer inverted and the phase offset value is no longer added to the modulating data. This pattern of amplitude negation and reversion to positive amplitude again can continue as many times as needed during the frame, or as many times as the phase threshold is exceeded.

Figure 5A:
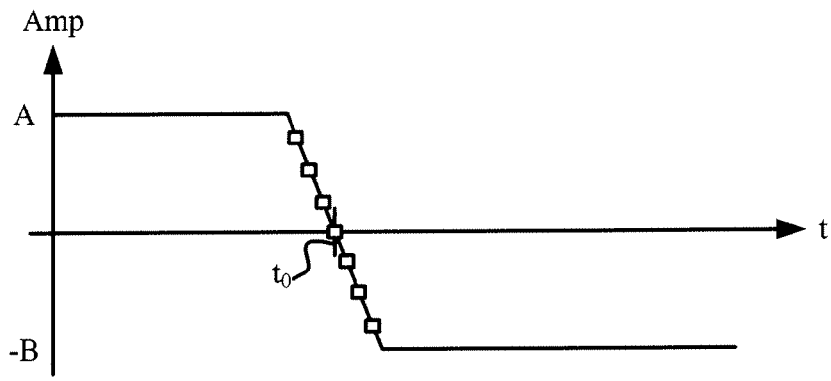
FIGS. 5A, 5B, and 5C are graphs illustrating amplitude, phase, and frequency waveforms, respectively, that may occur when moving from a first polar transmission point y to a second polar transmission point ŷ shown in FIGS. 2A and 2B using the polar transmitter of FIG. 4.
Figure 5B:
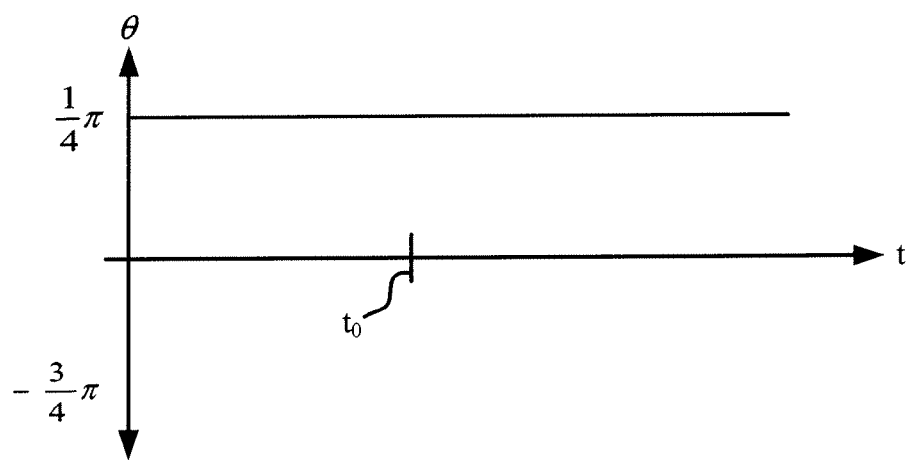
Figure 5C:
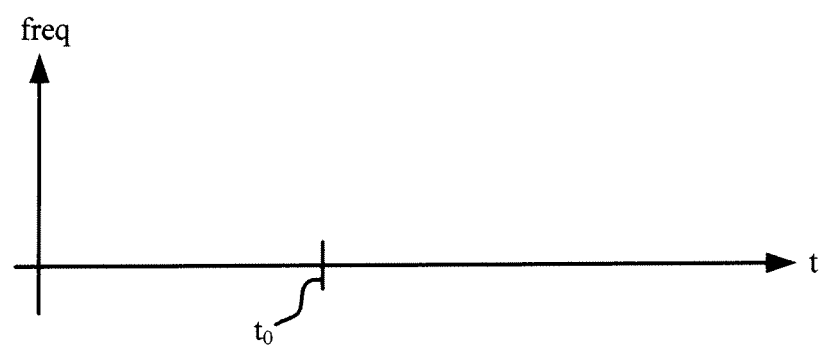

FIGS. 5A, 5B, and 5C are graphs illustrating amplitude, phase, and frequency waveforms, respectively, that may occur when moving from a first polar transmission point y to a second polar transmission point ŷ (shown in FIGS. 2A and 2B) using polar transmitter 400 (FIG. 4). The amplitude waveform of FIG. 5A shows an initial amplitude of A. The amplitude begins to decrease as the transmission point approaches the origin (see FIG. 2B). At time=$t_0$ the amplitude passes through zero and becomes negative. The amplitude continues to decrease until the amplitude equals −B. The squares shown along the path in FIG. 5A represent data points that may result from oversampling.

Figure 1:
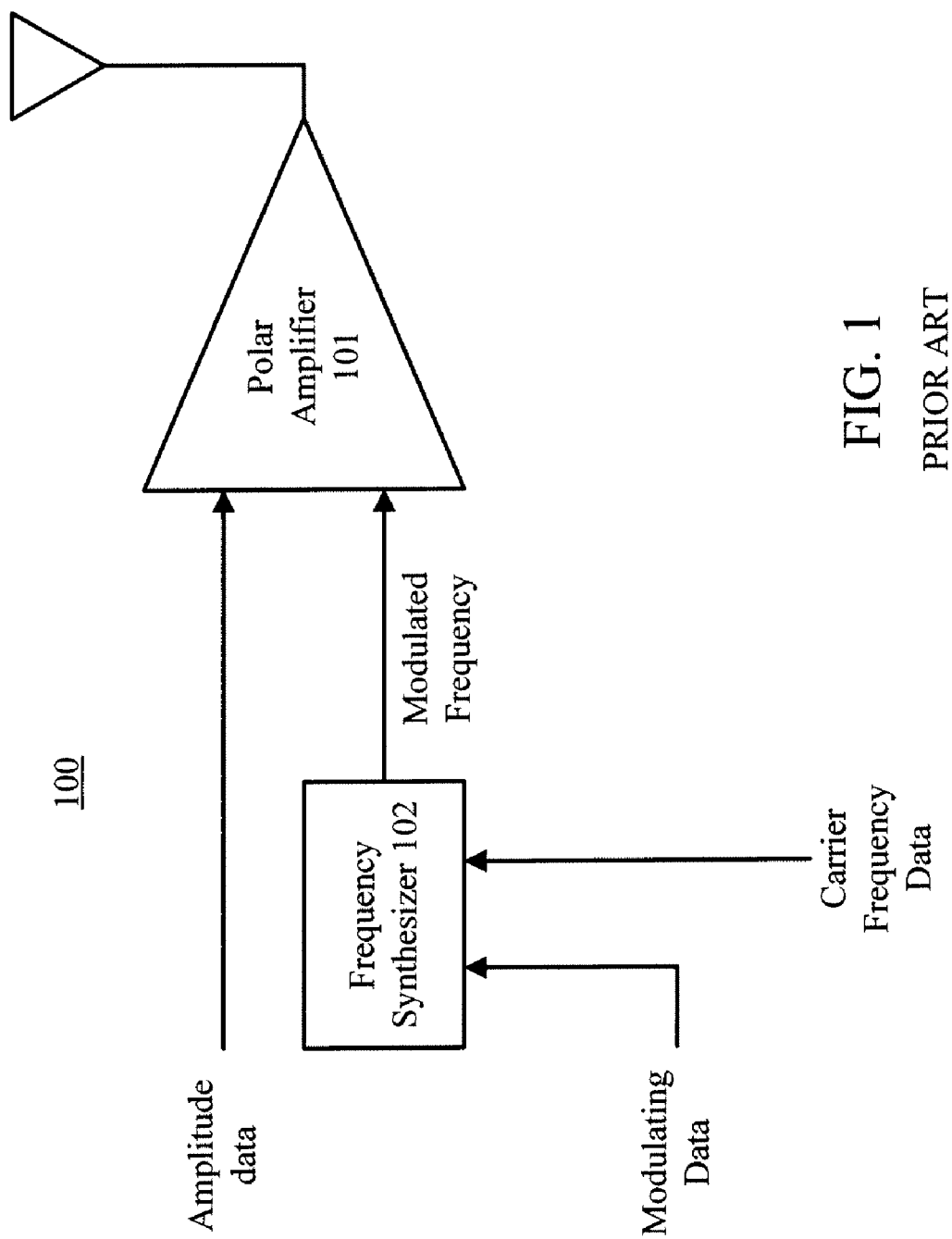
FIG. 1 is a conceptual diagram of a standard polar transmitter.
Figure 3A:
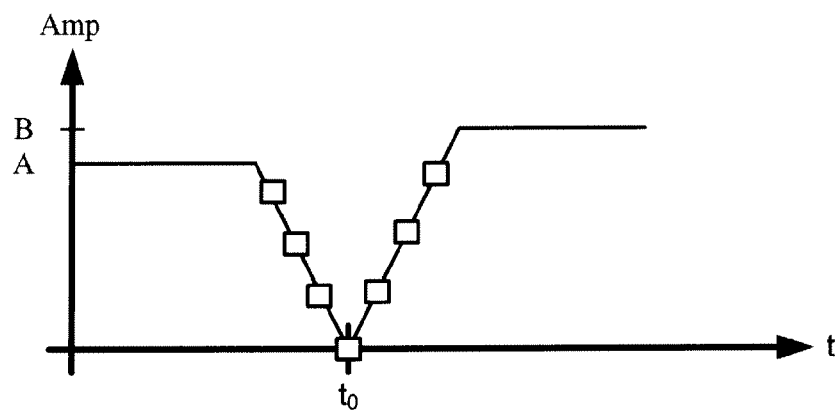
FIGS. 3A, 3B, and 3C are graphs illustrating amplitude, phase, and frequency waveforms, respectively, that may occur when moving from a first polar transmission point to a second polar transmission point using the discrete-time polar transmitter of FIG. 1.

Comparing the amplitude waveform graph of FIG. 5A with the amplitude waveform graph of FIG. 3A, note that in both cases the amplitude begins at A and decreases to zero at time=$t_0$. In the case of the standard polar amplifier 100 (FIG. 1), the amplitude reverses direction and increases after time=$t_0$, while in the case of the polar amplifier 400 (FIG. 4), the amplitude becomes negative and continues to decrease. In this example, because the amplitude is inverted, the phase (and therefore the frequency) does not change. The resulting phase and frequency waveforms are shown in FIGS. 5B and 5C, respectively. Because the phase and frequency do not change, the response requirement of frequency synthesizer 402 may be advantageously reduced.

Figure 6:
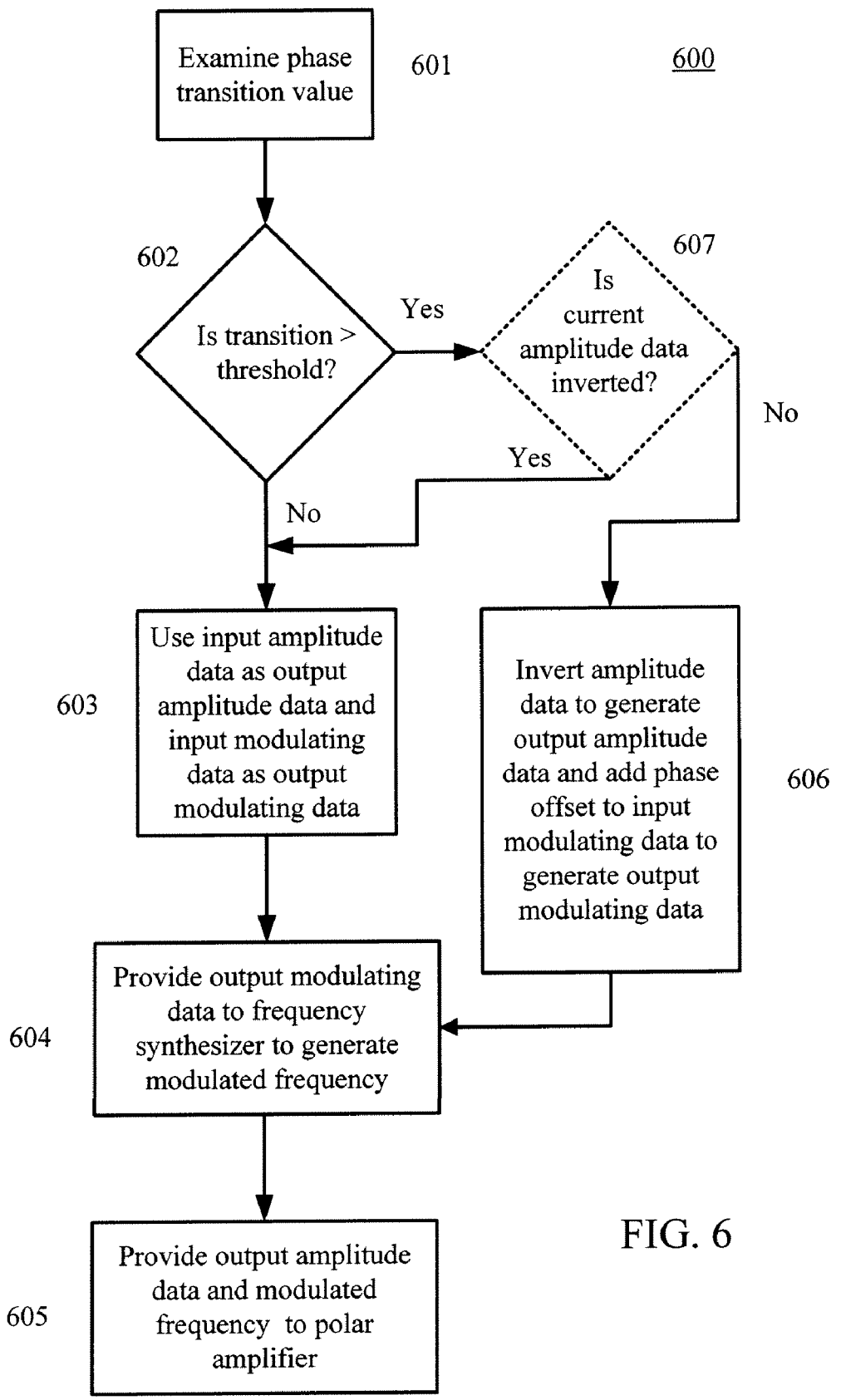
FIG. 6 is a flowchart of method steps for adjusting phase and amplitude data according to one or more aspects of the specification.

FIG. 6 is a flowchart of a method 600 for adjusting modulating and amplitude data for a polar amplifier according to one or more aspects of the specification. Method 600 begins by examining the phase transition value in step 601. If the phase transition does not exceed the phase transition threshold, as determined in step 602, then, for the second polar transmission point, the input amplitude data and the input modulating data are used for the output amplitude data and the output modulating data, respectively, in step 603. Step 604 provides the output modulating data to the frequency synthesizer to generate a modulated frequency. Step 605 provides the output amplitude data and the modulated frequency to the polar amplifier.

In contrast, if the phase transition value exceeds the phase transition threshold (as determined in step 602) and the current amplitude data is not inverted (as determined in step 607) then, for the second polar transmission point, the input amplitude data is inverted to generate the output amplitude data and a phase offset is added to the input modulating data to generate the output modulating data in step 606. Steps 604 and 605 follow step 606. On the other hand, if the phase transition value exceeds the phase transition threshold (as determined in step 602) and the current amplitude data is inverted (as determined in step 607) then, for the second polar transmission point, the input amplitude data and the input modulating data are used for the output amplitude data and the output modulating data, respectively, in step 603. Note that step 607 is optional, wherein in such an embodiment step 606 directly follows step 602 when the phase transition value is greater than the phase transition threshold.

As described above, the phase transition threshold allows the polar transmitter to select a plurality of phase transition values that allow the adjustment of amplitude and modulating data. In one embodiment, the phase transition threshold may be $$\frac{3}{4}\pi.$$

In another embodiment, the phase transition threshold may be programmable by software. When the phase transition value is approximately $\pi$, the amplitude may be inverted and the phase offset added as previously described. Thus, as shown in FIG. 2B, the adjusted amplitude and modulated frequency data may result in a path from point y to point ŷ that passes through the origin. However, when the absolute value of the phase transition is less than $\pi$, the path from the first polar transmission point to the second polar transmission point may not pass through the origin, which may result in the polar amplifier transmitting a signal with a relatively small amount of distortion. As the phase transition value deviates further from $\pi$, relatively more distortion may result. Therefore, modifying the phase transition threshold may influence the amount of distortion that may be transmitted by the polar transmitter.

Figure 7:
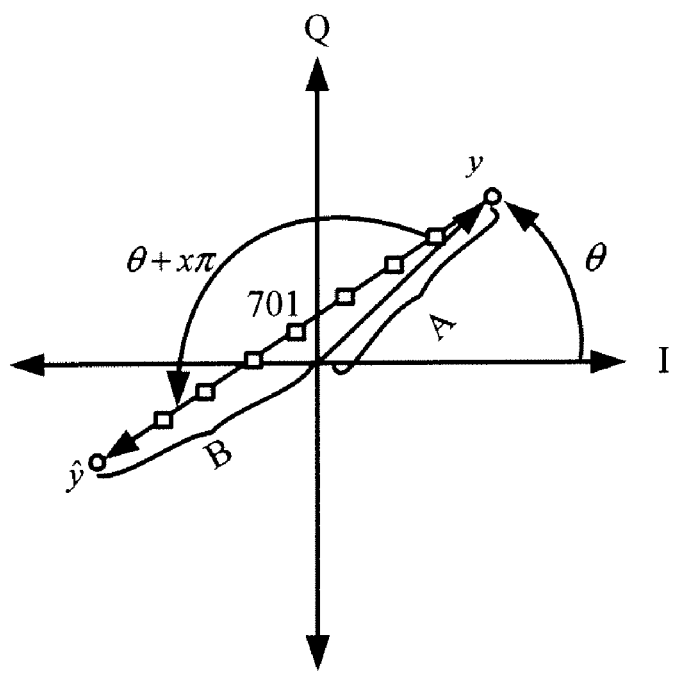
FIG. 7 is a graph illustrating two polar transmission points that may be transmitted by a polar transmitter.

FIG. 7 is a graph illustrating two polar transmission points that may be transmitted by a polar transmitter. FIG. 7 shows a first polar transmission point y with an amplitude A and a phase θ and a second polar transmission point ŷ with an amplitude B and a phase θ+xπ where x is less than one. In this example, the phase transition value from the first point y to the second point ŷ is less than $\pi$ and therefore the path from point y to point ŷ does not pass through the origin. As shown, a path 701 from y to ŷ may be illustrated by a relatively straight line, which may represent a relatively ideal path with relatively little distortion. The squares shown along path 700 in FIG. 7 represent data points that may result from oversampling.

Figure 8:
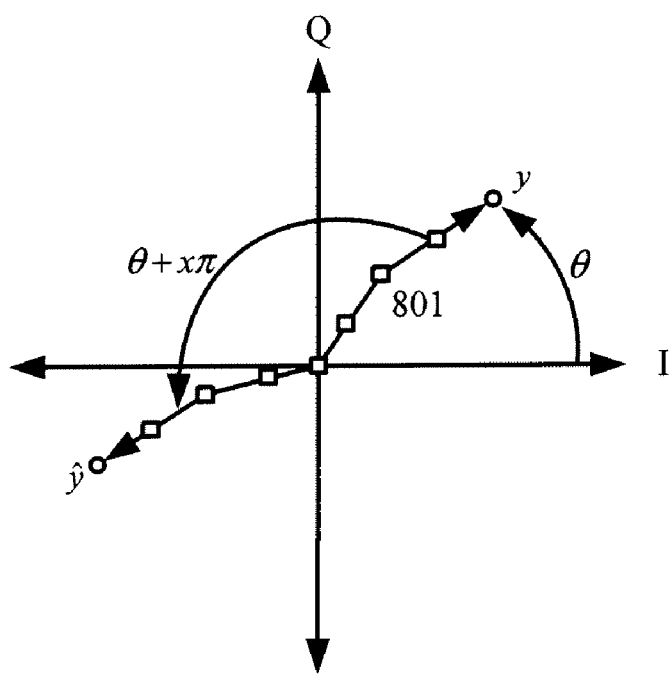
FIG. 8 is a graph illustrating two polar transmission points that may be transmitted by the polar transmitter of FIG. 4.

FIG. 8 is an exemplary graph illustrating two polar transmission points that may be transmitted by polar transmitter 400 (FIG. 4) using method 600 (FIG. 6). For the purposes of this example, the phase transition threshold may be $$\frac{3}{4}\pi.$$

Because the phase transition value between points y and ŷ is greater than the phase transition threshold, the input amplitude data may be inverted. More specifically, as the amplitude decreases, the amplitude is forced to zero and then inverted. At this point, the amplitude continues to decrease until a value of −B is reached. Because the path between y and ŷ crosses through the origin, a path 801 is no longer a relatively straight line and therefore differs from the relatively ideal case illustrated in FIG. 7. Because path 801 is non-ideal, the associated transmission may include some distortion. In some cases, this distortion may be reduced by filtering signals provided to the polar transmitter. The squares shown along path 801 represent data points that may result from oversampling.

Figure 9A:
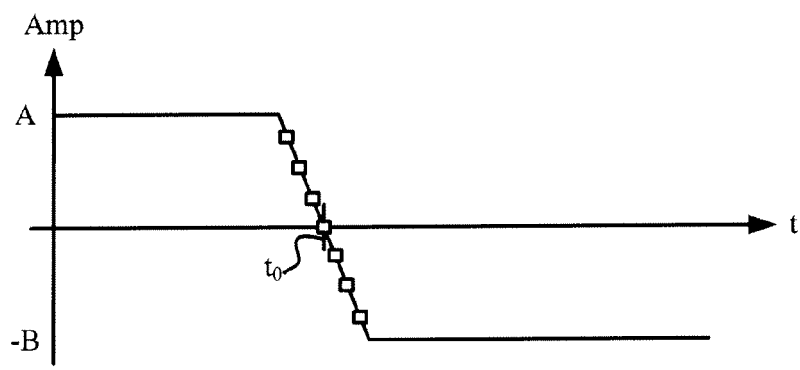
FIGS. 9A, 9B, and 9C are graphs illustrating amplitude, phase, and frequency waveforms, respectively, that may occur when moving from the first polar transmission point y to the second polar transmission point ŷ shown in FIG. 8.
Figure 9B:
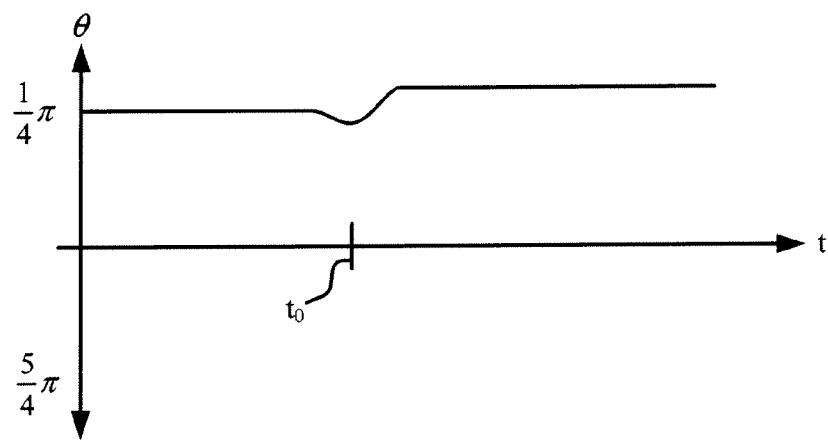
Figure 9C:
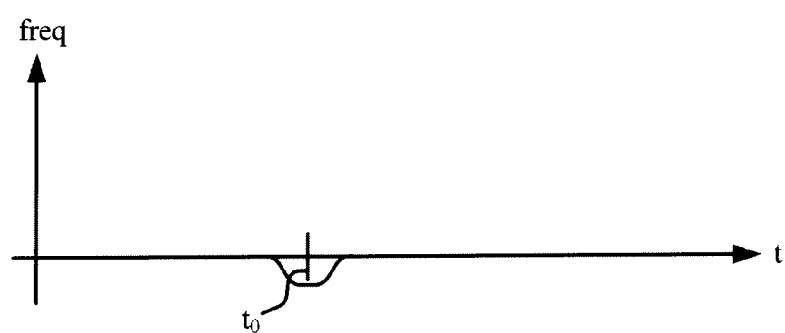

FIGS. 9A, 9B, and 9C are graphs illustrating amplitude, phase, and frequency waveforms, respectively, that may occur when moving from the first polar transmission point y to the second polar transmission point ŷ shown in FIG. 8. FIG. 9A shows the amplitude starting at A and decreasing to −B. In order to reach −B, the amplitude crosses through the zero point. Note that while the amplitude shown in FIG. 9A may be decreasing along a line, the corresponding amplitude change is shown as a line passing through the origin in FIG. 8. However, because the amplitude changes (negates), the phase θ advantageously stays relatively flat and only changes a relatively small amount. In this example, the phase transition is slightly less than $\pi$. Therefore, a relatively small amount of phase change may result, as shown in the phase waveform graph of FIG. 9B. If the phase transition is exactly $\pi$, the phase graph may look similar to the phase graph of FIG. 5B. Also, the relatively small phase changes shown in FIG. 9B may result in relatively small frequency changes as shown in FIG. 9C. The small frequency changes are more easily handled by the frequency synthesizer.

In another embodiment, a polar transmitter may include a polar amplifier configured with differential frequency inputs and a switch that may reverse the polarity of the frequency data by swapping the differential signals. In this embodiment, when the phase transition threshold is exceeded, the polarity of the frequency data may be changed while the frequency itself is held constant.

Figure 10:
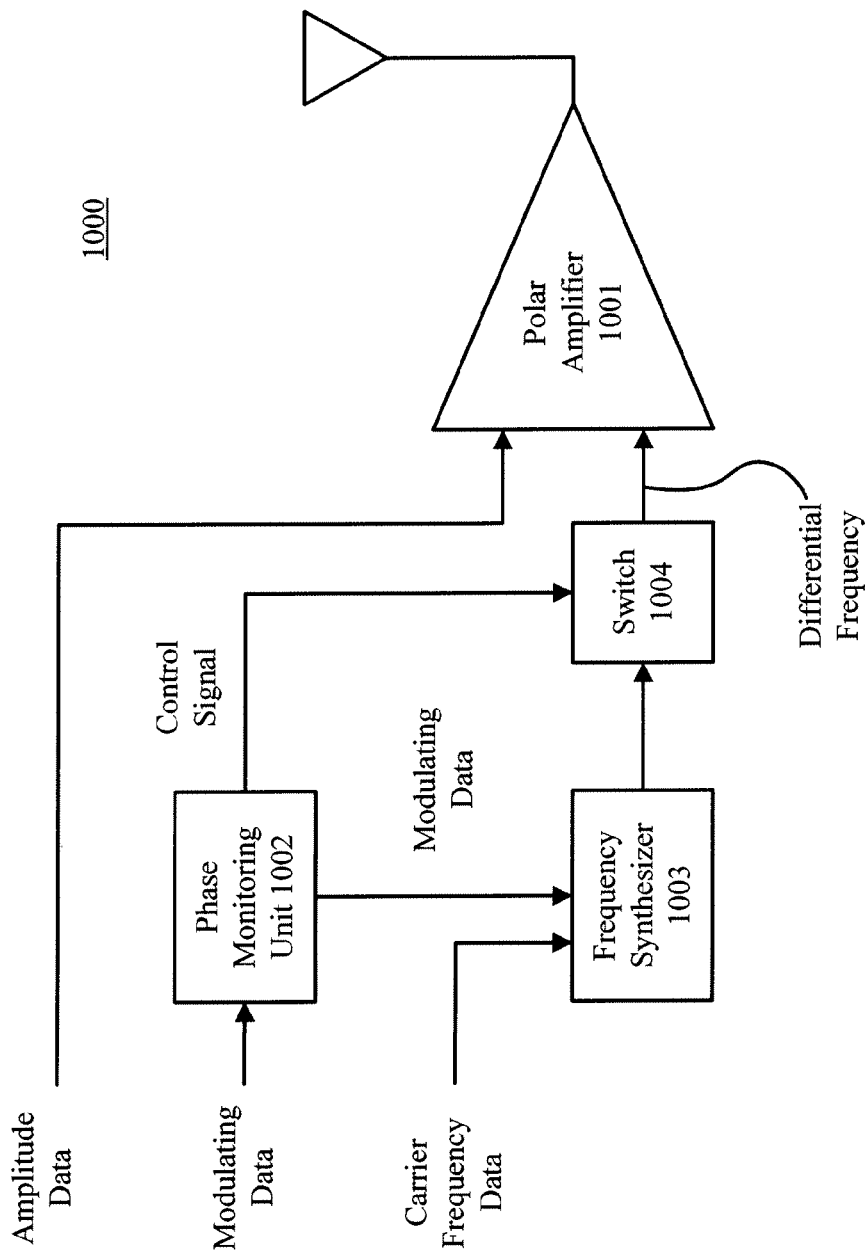
FIG. 10 is a conceptual diagram illustrating another polar transmitter configured according to the specification.

FIG. 10 is a conceptual diagram illustrating another polar transmitter 1000 configured according to the specification. Polar transmitter 1000 includes a phase monitoring unit 1002, a frequency synthesizer 1003, a switch 1004, and a polar amplifier 1001 (which is similar to polar transmitter 400 of FIG. 4). In one embodiment, the output of frequency synthesizer 1003, switch 1004, and the modulated frequency input of polar amplifier may be configured to handle differential data and switch 1004 may have a double-pole-double-throw (DPDT) architecture.

Carrier frequency data is provided to an input of frequency synthesizer 1003. Modulating data is provided to an input of phase monitoring unit 1002, which passes the modulating data to another input of frequency synthesizer 1003. Based on the modulating data, phase monitoring unit 1002 generates a control signal that is provided to a control input of switch 1004. The output of frequency synthesizer 1003 is a modulated frequency waveform, which is provided to an input of switch 1004. The output of switch 1004 is provided to the modulated frequency waveform input of polar amplifier 1001. Amplitude data is provided to another input of polar amplifier 1001.

When phase monitoring unit 1002 determines that the phase transition threshold is exceeded, phase monitoring unit 1002 sends a control signal having a first predetermined value to switch 1004, which inverts the phase of the frequency data provided to polar amplifier 1001 by $\pi$. Notably, the phase may be inverted by swapping the signals that are coupled to the differential inputs of polar amplifier 1001 with switch 1004.

Figure 3B:
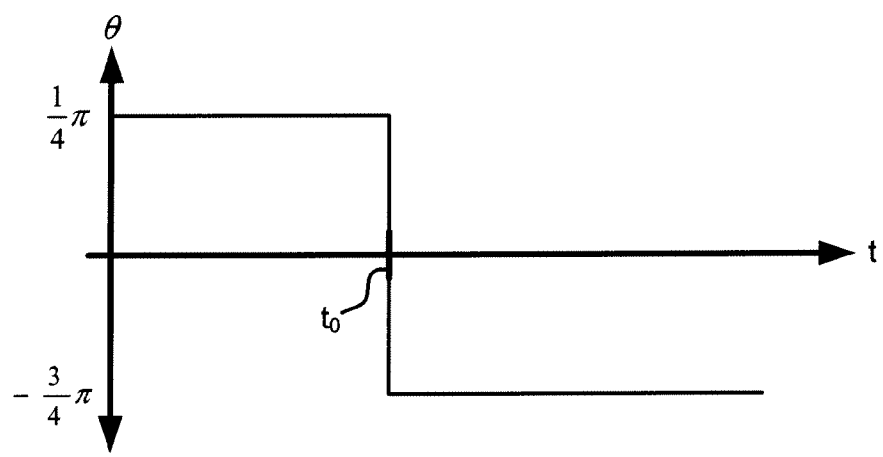
Figure 3C:
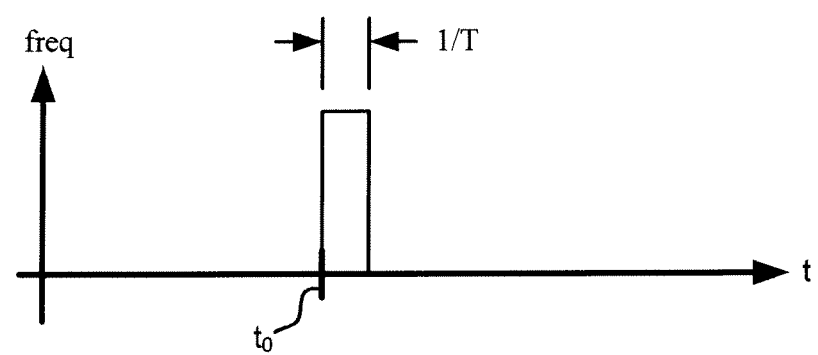

Note that the phase advantageously is changed while the frequency remains relatively constant. The phase output waveform for such a frequency change is similar to the waveform shown in FIG. 3B. The phase waveform as viewed from the modulated frequency waveform input of the switch 1004 would be similar to the waveform shown in FIG. 5B. In contrast, the frequency waveform for such a change is similar to the waveform shown in FIG. 5C. In other embodiments, the polar transmitter may be configured with other frequency data inputs that allow the polarity of the frequency data to be inverted, such as an input that may function as a sign bit. In such an embodiment, switch 1004 may not be required to invert the phase of the frequency data and may be deleted or bypassed.

Although illustrative embodiments of the invention have been described in detail herein with reference to the accompanying drawings, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A polar transmitter comprising:
 a phase monitoring unit for receiving input modulating data;
 an amplitude negation unit for receiving amplitude data and a control signal from the phase monitoring unit;
 a frequency synthesizer for receiving carrier frequency data and output modulating data from the phase monitoring unit; and
 a polar amplifier for receiving outputs of the amplitude negation unit and the frequency synthesizer,
 wherein a value of the control signal is based on whether a magnitude of a phase transition in the input modulating data exceeds a predetermined threshold.

2. The polar transmitter of claim 1, wherein the predetermined threshold is set to a fraction of $\pi$.

3. The polar transmitter of claim 1, wherein the phase monitoring unit outputs a sum of a phase offset and the input modulating data when the phase transition exceeds the predetermined threshold.

4. A polar transmitter comprising:
 a phase monitoring unit for receiving input modulating data;
 an amplitude negation unit for receiving amplitude data and a control signal from the phase monitoring unit;
 a frequency synthesizer for receiving carrier frequency data and output modulating data from the phase monitoring unit; and
 a polar amplifier for receiving outputs of the amplitude negation unit and the frequency synthesizer,
 wherein a value of the control signal is based on whether a magnitude of a phase transition in the input modulating data exceeds a predetermined threshold and whether a current amplitude data is inverted.

5. The polar transmitter of claim 4, wherein the predetermined threshold is set to a fraction of $\pi$.

6. The polar transmitter of claim 4, wherein the phase monitoring unit outputs a sum of a phase offset and the input modulating data when the phase transition exceeds the predetermined threshold and the current amplitude data is not inverted.

7. The polar transmitter of claim 4, wherein the phase monitoring unit outputs the input modulating data when the phase transition exceeds the predetermined threshold and the current amplitude data is inverted.

8. The polar transmitter of claim 1, wherein the amplitude negation unit outputs inverted amplitude data when the magnitude of the phase transition exceeds the predetermined threshold as indicated by the control signal.

9. The polar transmitter of claim 1, wherein the amplitude negation unit outputs the amplitude data when the phase transition does not exceed the predetermined threshold as indicated by the control signal.

10. The polar transmitter of claim 4, wherein the amplitude negation unit outputs inverted amplitude data when the magnitude of the phase transition exceeds the predetermined threshold and the current amplitude data is not inverted as indicated by the control signal.

11. The polar transmitter of claim 4, wherein the amplitude negation unit outputs the amplitude data when the phase transition exceeds the predetermined threshold and the current amplitude data is inverted as indicated by the control signal.

12. A polar transmitter comprising:
 a phase monitoring unit for monitoring input modulating data, generating a control signal whose value is dependent on whether a phase transition in the input modulating data exceeds a phase transition threshold, and generating output modulating data;
 an amplitude negation unit for receiving input amplitude data and the control signal and generating output amplitude data;
 a frequency synthesizer for receiving carrier frequency data and the output modulating data and generating a modulated frequency; and
 a polar amplifier for receiving the modulated frequency and the output amplitude data and generating a transmit signal.

13. The polar transmitter of claim 12, wherein the phase transition threshold is set to a fraction of $\pi$.

14. The polar transmitter of claim 12, wherein the phase monitoring unit outputs a sum of a phase offset and the input modulating data when the phase transition exceeds the phase transition threshold.

15. The polar transmitter of claim 12, wherein the phase monitoring unit outputs the input modulating data when the phase transition does not exceed the phase transition threshold.

16. The polar transmitter of claim 12, wherein the amplitude negation unit outputs inverted amplitude data when the phase transition exceeds the phase transition threshold as indicated by the control signal.

17. The polar transmitter of claim 12, wherein the amplitude negation unit outputs the amplitude data when the phase transition does not exceed the phase transition threshold as indicated by the control signal.

18. A polar transmitter comprising:
    a phase monitoring unit for monitoring input modulating data, generating a control signal whose value is dependent on whether a phase transition in the input modulating data exceeds a phase transition threshold and whether a current amplitude data is inverted, and generating output modulating data;
    an amplitude negation unit for receiving input amplitude data and the control signal and generating output amplitude data;
    a frequency synthesizer for receiving carrier frequency data and the output modulating data and generating a modulated frequency; and
    a polar amplifier for receiving the modulated frequency and the output amplitude data and generating a transmit signal.

19. The polar transmitter of claim 18, wherein the phase transition threshold is set to a fraction of $\pi$.

20. The polar transmitter of claim 18, wherein the phase monitoring unit outputs a sum of a phase offset and the input modulating data when the phase transition exceeds the phase transition threshold and the current amplitude data is not inverted.

21. The polar transmitter of claim 18, wherein the phase monitoring unit outputs the input modulating data when the phase transition exceeds the phase transition threshold and the current amplitude data is inverted.

22. The polar transmitter of claim 18, wherein the amplitude negation unit outputs inverted amplitude data when the phase transition exceeds the phase transition threshold and the current amplitude data is not inverted as indicated by the control signal.

23. The polar transmitter of claim 18, wherein the amplitude negation unit outputs the amplitude data when the phase transition exceeds the phase transition threshold and the current amplitude data is inverted as indicated by the control signal.

24. A method of providing signals to a polar amplifier, the method comprising:
    monitoring input modulating data;
    generating a control signal whose value is dependent on whether a phase transition in the input modulating data exceeds a phase transition threshold;
    generating output modulating data, wherein the output modulating data is one of:
        the input modulating data when the phase transition does not exceed the phase transition threshold, and
        a sum of the input modulating data and a phase offset when the phase transition exceeds the phase transition threshold;
    receiving input amplitude data and generating output amplitude data based on the control signal, wherein the output amplitude data is one of:
        the input amplitude data when the phase transition does not exceed the phase transition threshold, and
        inverted input amplitude data when the phase transition exceeds the phase transition threshold;
    receiving carrier frequency data and the output modulating data and generating a modulated frequency; and
    providing the modulated frequency and the output amplitude data to the polar amplifier.

25. The method of claim 24, wherein the phase transition threshold is set to a fraction of $\pi$.

26. A method of providing signals to a polar amplifier, the method comprising:
    monitoring input modulating data;
    generating a control signal whose value is dependent on whether a phase transition in the input modulating data exceeds a phase transition threshold and whether a current amplitude data is inverted;
    generating output modulating data, wherein the output modulating data is one of:
        the input modulating data when the phase transition does not exceed the phase transition threshold,
        the input modulating data when the phase transition exceeds the phase transition threshold and the current amplitude data is inverted, and
        a sum of the input modulating data and a phase offset when the phase transition exceeds the phase transition threshold and the current amplitude data is not inverted;
    receiving input amplitude data and generating output amplitude data based on the control signal, wherein the output amplitude data is one of:
        the input amplitude data when the phase transition does not exceed the phase transition threshold, and
        the input amplitude data when the phase transition exceeds the phase transition threshold and the current amplitude data is inverted, and
        inverted input amplitude data when the phase transition exceeds the phase transition threshold and the current amplitude data is not inverted;
    receiving carrier frequency data and the output modulating data and generating a modulated frequency; and
    providing the modulated frequency and the output amplitude data to the polar amplifier.

27. The method of claim 26, wherein the phase transition threshold is set to a fraction of $\pi$.

* * * * *